United States Patent
Tan et al.

(10) Patent No.: US 7,403,021 B2
(45) Date of Patent: Jul. 22, 2008

(54) TESTING CIRCUIT FOR A DATA INTERFACE

(75) Inventors: Yi-Cai Tan, Shenzhen (CN); Ren-Jun Xiao, Shenzhen (CN); Kun-Lung Wu, Tu-Cheng (TW)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/518,791

(22) Filed: Sep. 11, 2006

(65) Prior Publication Data

US 2007/0118322 A1    May 24, 2007

(30) Foreign Application Priority Data

Oct. 20, 2005    (CN) .................... 2005 1 0100541

(51) Int. Cl.
*G01R 31/04* (2006.01)
(52) U.S. Cl. .................... 324/679; 324/538; 714/43
(58) Field of Classification Search ............ 324/679, 324/76.11, 538; 714/43
See application file for complete search history.

(56) References Cited

U.S. PATENT DOCUMENTS

| 4,149,160 | A  | * | 4/1979  | Bozarth et al. ............ 340/661 |
| 6,323,694 | B1 | * | 11/2001 | Creek ......................... 327/69 |
| 6,785,853 | B2 |   | 8/2004  | Takahashi |
| 6,829,726 | B1 | * | 12/2004 | Korhonen ................... 714/25 |
| 6,940,303 | B2 | * | 9/2005  | Vargas ........................ 326/30 |
| 2004/0102917 | A1 | * | 5/2004 | Chen et al. ................. 702/120 |

* cited by examiner

*Primary Examiner*—Vincent Q Nguyen
(74) *Attorney, Agent, or Firm*—Morris Manning Martin LLP; Tim Tingkang Xia, Esq.

(57) ABSTRACT

A testing circuit for an interface includes a load feeding circuit and a voltage testing circuit. The load feeding circuit includes a resistance-regulating unit, a first comparator, a pass element, and a capacitor. The resistance-regulating unit is connected to a positive input of the first comparator. A negative input of the first comparator is connected to the capacitor and a first terminal of the pass element. An output of the first comparator is connected to a second terminal of the pass element. A third terminal of the pass element is connected to the interface. The voltage testing circuit includes a second comparator and a display member connected to the second comparator. The voltage of the interface and a reference voltage are input to inputs of the second comparator, and the second comparator outputs a signal to control the display member to display a comparison result.

12 Claims, 2 Drawing Sheets

TESTING CIRCUIT FOR A DATA INTERFACE

BACKGROUND OF THE INVENTION

1. Field of the Invention

The present invention relates to a testing circuit, and particularly to a testing circuit for a data interface.

2. General Background

The use of a Universal Serial Bus (USB) interface for coupling a peripheral device, such as a modem, a digital camera, a scanner, a keyboard, and/or a mouse, to a host computer/controller has become well known. Moreover, the maximum transmission rate of the USB interface is continually increasing. For example, while the USB 1.0 standard provided a transmission rate of 12 Mb/s, the USB 2.0 standard provides for a transmission rate of 480 Mb/s. As the speed of data transmission continually increases, it is becoming increasingly important and yet, more difficult to accurately test the performance of the USB interface. In general, a power supply provides a 5V voltage to the USB interface. The USB 2.0 standard requires the working voltage of the USB interface be between 4.75V and 5.25V. So, when the USB interface is coupled to a peripheral device, if the voltage of the USB interface is lower than 4.75V, the USB interface cannot provide a normally functioning connection between the peripheral device and the host computer.

What is needed is a testing circuit for a data interface which can detect whether a working voltage of the data interface reaches the minimum voltage with different loads.

SUMMARY

An exemplary testing circuit is adapted for an interface. The testing circuit includes a load feeding circuit and a voltage testing circuit. The load feeding circuit includes a resistance-regulating unit, a first comparator, a pass element, and a capacitor. The resistance-regulating unit is connected to a positive input of the first comparator, and a negative input of the first comparator is connected to the capacitor and a first terminal of the pass element. An output of the first comparator is connected to a second terminal of the pass element, and a third terminal of the pass element is connected to the interface. The voltage testing circuit includes a second comparator and a display member connected to an output of the second comparator. The voltage of the interface is input to one input of the second comparator to be compared with a reference voltage, and then, the second comparator outputs a signal to control the display member to display a comparison result. The testing circuit can detect whether a working voltage of the interface reaches the minimum voltage with different loads.

Other objects, advantages and novel features will become more apparent from the following detailed description when taken in conjunction with the accompanying drawings, in which:

DETAILED DESCRIPTION OF THE EMBODIMENTS

Figure 1:
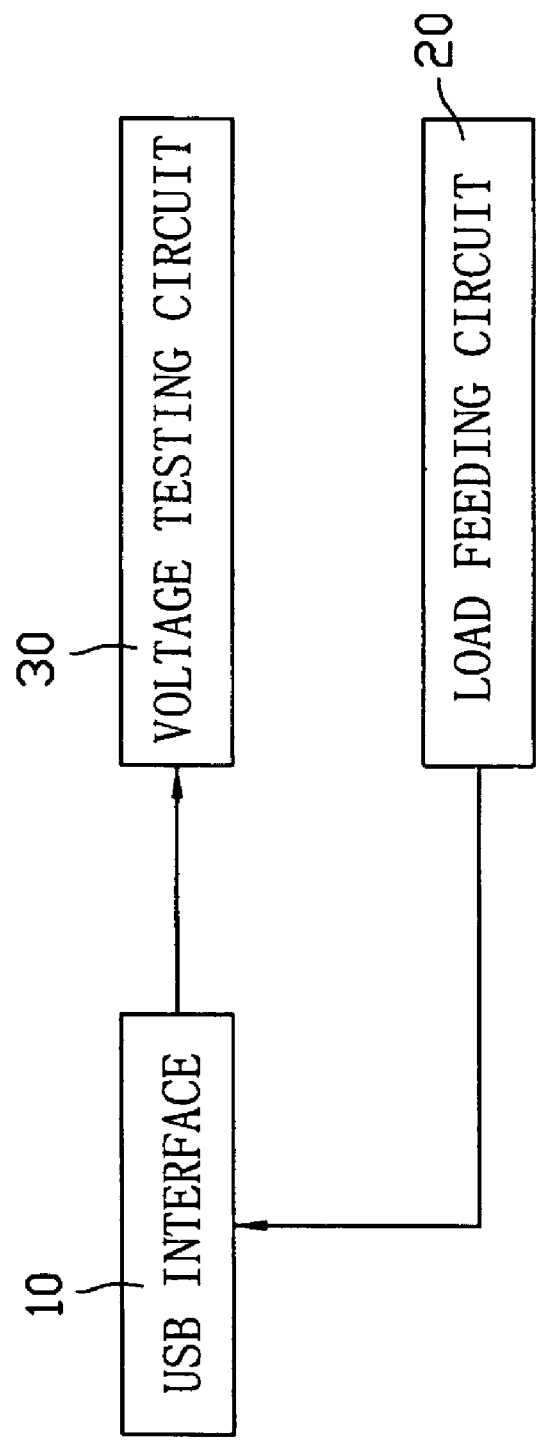
FIG. 1 is a block diagram of a testing circuit for an interface, in accordance with a preferred embodiment of the present invention.

Referring to FIG. 1, a testing circuit for a USB interface 10 of a preferred embodiment of the present invention includes a load feeding circuit 20, and a voltage testing circuit 30. The load feeding circuit 20 regulates a load of the USB interface 10, and the voltage testing circuit 30 detects whether a voltage of the USB interface 10 reaches a minimum voltage when different loads are applied to the USB interface 10.

Figure 2:
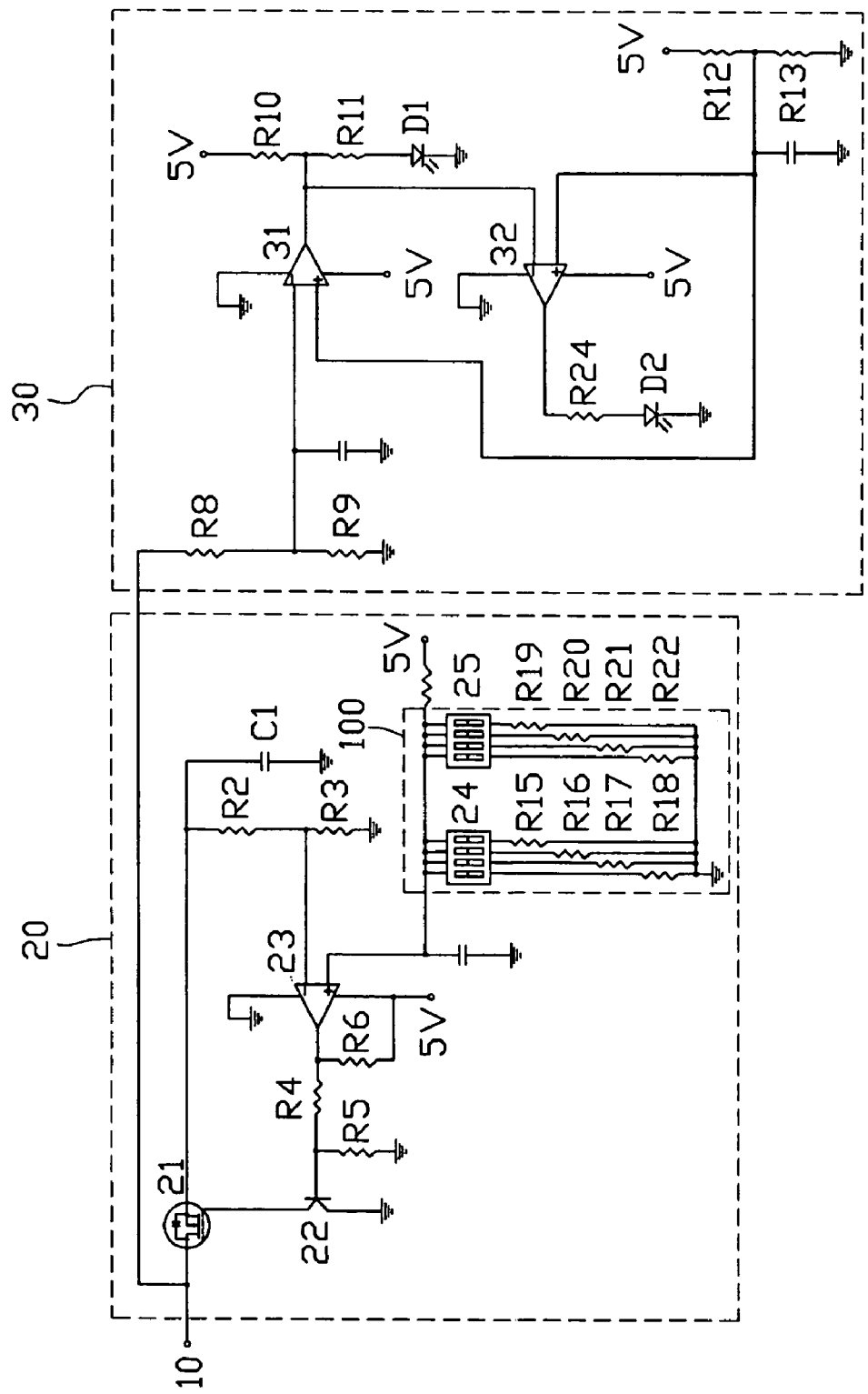
FIG. 2 is a circuit diagram of the FIG. 1.

Referring to FIG. 2, the load feeding circuit 20 includes pass elements, such as a MOSFET (MOS) transistor 21, and a bipolar junction transistor (BJT) 22, a resistance-regulating unit 100, and a first comparator 23. The resistance-regulating unit 100 includes two switches 24 and 25. Each of the switches 24, 25 has eight ends. Four ends of the switch 24 are respectively connected to grounded resistors R15, R16, R17, and R18. Four ends of the switch 25 are respectively connected to grounded resistors R19, R20, R21, and R22. By operating the switches 24 and 25, one or more of these eight resistors can be selectively connected to the load feeding circuit 20. Thus, the resistance value of the resistance-regulating unit 100 can be adjusted. A gate of the MOS transistor 21 is connected to the USB interface 10. A source of the MOS transistor 21 is connected to a capacitor C1, and a resistor R2. The resistor R2 is connected in series to a resistor R3. A drain of the MOS transistor 21 is connected to a collector of the BJT 22. A base of the BJT 22 is connected to an output of the comparator 23 via a resistor R4. A resistor R5 is connected between a node of the base of the BJT 22 and the resistor R4 and ground. A voltage terminal of the comparator 23 receives a 5V voltage input. A resistor R6 is inserted between the output and the voltage terminal of the comparator 23. A positive input of the comparator 23 is connected to the other four ends of the switch 24 and the switch 25. A 5V voltage is input to the positive input of the comparator 23 via the resistance-regulating unit 100. A negative input of the comparator 23 is connected to a node between the resistors R2 and R3.

The voltage testing circuit 30 includes a second comparator 31, and a third comparator 32. A negative input of the second comparator 31 is connected to the USB interface 10 via a resistor R8. A grounded resistor R9 is connected between the resistor R8 and the negative input of the second comparator 31. An output of the second comparator 31 is connected to a node between a resistor R10 and a resistor R11. A 5V voltage is input to the resistor R10. A grounded light emitting diode (LED) D1 is connected to the resistor R11 in series. A negative input of the third comparator 32 is connected to the output of the second comparator 31. A positive input of the third comparator 32 is connected to the positive input of the second comparator 31, and connected to a node between resistors R12 and R13. A 5V voltage is input to the resistor R12 and the resistor R13 is grounded. An output of the third comparator 32 is connected to a resistor R24 and a grounded LED D2 in series. Voltage terminals of the comparators 31 and 32 are input a 5V voltage respectively.

A working process of the testing circuit is as follows. The first step is to apply a load to the USB interface 10 by controlling the switches 24 and 25 to adjust the value of resistance regulating the voltage applied as a load. The voltage of the negative input tends to be equal to that of the positive input of the first comparator 23. If the voltage of the negative input is lower than that of the positive input, the first comparator 23 outputs a high level voltage. The high level voltage is divided by the resistors R4 and R5, and then input to the base of the BJT 22. The BJT 22 is turned on, and so the MOS transistor 21 is turned on. Thus, the capacitor C1 is charged, and the voltage of the negative input is increased until the voltage of the negative input is equal to that of the positive input. If the voltage of the negative input is higher than that of the positive input, the first comparator 23 outputs a low level voltage to the base of the BJT 22. The BJT 22 is turned off and the MOS transistor 21 is also turned off. Therefore, the capacitor C1 is discharged, and the voltage of the negative input is decreased until the voltage of the negative input is equal to the positive input. That is to say, the load applied to the USB interface 10 can be regulated by changing the voltage of the positive input. So, the load applied to the USB interface 10 is determined by a resistance value of the resistance-regulating unit 100. The following second step is to test whether the voltage of the USB interface 10 reaches a minimum voltage. The 5V voltage is divided by the resistor R12 and R13 and then input to the positive inputs of the second comparator 31 and the third comparator 32. The voltage of the USB interface 10 is input to the negative input of the second comparator 31 and compared with the voltage of the positive input. If the voltage of the USB interface 10 is lower than the voltage of the positive input, the second comparator 31 outputs two high level voltages to the LED D1 and the negative input of the third comparator 32. So the voltage of the negative input of the third comparator 32 is higher than the voltage of the positive input of the third comparator 32. Therefore, the LED D1 is turned on, and the LED D2 is not. Similarly, if the voltage of the USB interface 10 is higher than or equal to the voltage of the positive input of the second comparator 31, the LED D1 is not turned on, and the LED D2 is turned on. The resistance values of resistors R12 and R13 can be regulated, in order that the voltage input to the positive input of the second comparator 31 is equal to the minimum voltage value. Thus, when the voltage of the USB interface 10 is lower than the minimum voltage value, the LED D1 will light, and when the voltage of the USB interface 10 meets with the minimum voltage value, the LED D2 will light. Therefore, the testing circuit of the present invention can advantageously detect and display whether a working voltage of the USB interface 10 reaches the minimum voltage, when different loads are applied to the USB interface 10. In addition, the testing circuit can be used on other data interfaces besides USB interfaces.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

We claim:

1. A testing circuit adapted for an interface, the testing circuit comprising:
   a load feeding circuit comprising a resistance-regulating unit, a first comparator, a pass element, and a capacitor, the resistance-regulating unit connected to a positive input of the first comparator, a negative input of the first comparator connected to the capacitor and a first terminal of the pass element, an output of the first comparator connected to a second terminal of the pass element, a third terminal of the pass element connected to the interface, a load applied to the interface being regulated by changing a resistance value of the resistance-regulating unit; and
   a voltage testing circuit comprising a second comparator and a display member connected to an output of the second comparator, a voltage of the interface being input to one input of the second comparator to compare with a reference voltage, the second comparator outputting a signal to control the display member to display a comparison result.

2. The testing circuit as claimed in claim 1, wherein the resistance-regulating unit comprises a plurality of switches, each switch connected with at least one resistor, and the resistance value of the resistance-regulating unit can be regulated by operating the switches.

3. The testing circuit as claimed in claim 1, wherein the pass element comprises a MOSFET transistor, a drain of the MOSFET transistor connected to the interface, a source of the MOSFET transistor connected to the negative input of the first comparator, a gate of the MOSFET connected to the output of the first comparator.

4. The testing circuit as claimed in claim 3, wherein the pass element further comprises a bipolar junction transistor (BJT), a collector of the BJT connected to the gate of the MOSFET transistor, a base of the BJT connected to the output of the first comparator.

5. The testing circuit as claimed in claim 1, wherein the display member comprises a first light emitting diode (LED), the first LED connected to the output of the second comparator, and when the second comparator outputs a high level voltage, the first LED is lit.

6. The testing circuit as claimed in claim 5, farther comprising a third comparator and a second LED, wherein the other input of the second comparator is connected to one input of the third comparator, the output of the second comparator is connected to the other input of the third comparator, the third LED is connected to an output of the third comparator, and when the second comparator outputs a low level voltage, the third LED is lit.

7. A testing circuit adapted for an interface, the testing circuit comprising:
   a first comparator, a negative input of the first comparator connected to the interface, a positive input of the first comparator being input a reference voltage;
   a second comparator, a positive input of the second comparator being input the reference voltage, a negative input of the second comparator connected to an output of the first comparator;
   a first display member connected to the output of the first comparator, the voltage of the interface being compared with the reference voltage, the first comparator outputting a signal to control the first display member to display a comparison result;
   a second display member connected to an output of the second comparator, the voltage from the output of the first comparator being compared with the reference voltage, the second comparator outputting a signal to control the second display member to display a comparison result; and
   a load feeding circuit, wherein the load feeding circuit comprises a resistance-regulating unit, a third comparator, a pass element, and a capacitor, a negative input of the third comparator is connected to the capacitor and a first terminal of the pass element, an output of the third comparator is connected to a second terminal of the pass element, a third terminal of the pass element is connected to the interface, a load applied to the interface is regulated by changing a resistance value of the resistance-regulating unit.

8. The testing circuit as claimed in claim 7, wherein the first display member and the second display member comprise a light emitting diode (LED) respectively, and when the first comparator/the second comparator outputs a high level voltage, the corresponding LED is lit.

9. The testing circuit as claimed in claim 7, wherein the pass element comprises a MOSFET transistor, a drain of the MOSFET transistor connected to the interface, a source of the MOSFET transistor connected to the negative input of the third comparator, a gate of the MOSFET transistor connected to the output of the third comparator.

10. The testing circuit as claimed in claim 9, wherein the pass element further comprises a bipolar junction transistor (BJT), a collector of the BJT connected to the gate of the MOSFET transistor, a base of the BJT connected to the output of the third comparator.

11. A circuit for testing an interface, comprising:

a load feeding circuit electrically connectable with an interface to be tested to provide different loads for said interface to function, said load feeding circuit comprising a resistance-regulating unit so as to change said provided loads for said interface by means of varying a resistance value of said resistance-regulating unit; and a voltage testing circuit electrically connectable with said interface to receive output of said interface, said voltage testing circuit comprising a display member and a comparator electrically connectable between said interface and said display member, said comparator receiving different output voltages from said interface functioning under said different loads and a reference voltage for comparison in order to controllably output to said display member for displaying comparison results of said output voltages and said reference voltage.

12. The circuit as claimed in claim 11, wherein said resistance-regulating unit comprises a plurality of switches, each of which is electrically connectable with at least one resistor, said resistance value of said resistance-regulating unit is able to vary by operation of said plurality of switches.

* * * * *